(12) United States Patent
Achter

(10) Patent No.: US 7,561,484 B2
(45) Date of Patent: Jul. 14, 2009

(54) REFERENCE-FREE SAMPLED SENSING

(75) Inventor: Michael Achter, Mountain View, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/955,802

(22) Filed: Dec. 13, 2007

(65) Prior Publication Data

US 2009/0154261 A1 Jun. 18, 2009

(51) Int. Cl.
*G11C 7/00* (2006.01)
(52) U.S. Cl. .................. 365/208; 365/185.21; 365/207
(58) Field of Classification Search .................. 365/208
See application file for complete search history.

(56) References Cited

U.S. PATENT DOCUMENTS

| 3,919,566 | A | * | 11/1975 | Millhollan et al. ............. 327/52 |
|---|---|---|---|---|
| 4,054,865 | A | * | 10/1977 | Shirato ........................ 365/186 |
| 5,594,697 | A | * | 1/1997 | Hirano et al. ............ 365/185.21 |
| 6,188,615 | B1 | * | 2/2001 | Perner et al. ................ 365/158 |
| 6,760,266 | B2 | * | 7/2004 | Garni et al. ................. 365/209 |
| 6,999,345 | B1 | * | 2/2006 | Park et al. ............... 365/185.18 |
| 7,477,555 | B2 | * | 1/2009 | Anand et al. ................ 365/196 |
| 2006/0126387 | A1 | * | 6/2006 | Kim et al. .............. 365/185.17 |

* cited by examiner

*Primary Examiner*—Tan T. Nguyen
(74) *Attorney, Agent, or Firm*—Turocy & Watson, LLP

(57) ABSTRACT

Systems and methods for extending the usable lifetime of memory cells by utilizing reference-free sampled sensing. A stimulus component applies a plurality of different stimuli to a plurality of memory cells of a memory device. A sense component senses a characteristic of each memory cell of the plurality of memory cells as a function of the applied plurality of different stimuli. An analysis component determines a logic state of each memory cell of the plurality of memory cells as a function of the sensed characteristic of each memory cell of the plurality of memory cells.

18 Claims, 12 Drawing Sheets

REFERENCE-FREE SAMPLED SENSING

TECHNICAL FIELD

This disclosure relates generally to systems for sensing memory devices and in particular, but not exclusively, relates to reference-free sampled sensing of memory devices.

BACKGROUND

A wide variety of memory devices can be used to maintain and store data and instructions for various computers and similar systems, including non-volatile memory devices that do not require power to retain information (e.g., EPROM, EEPROM, and Flash memory).

Memory devices contain memory cells, which store information in the form of binary bit(s) (e.g., logic state "0", "1", "00", "01", "10", or "11"). Conventional technology senses the logic state of memory cells utilizing fixed and/or dynamic tracking references, comparing a sensed current/voltage with a fixed and/or dynamic tracking reference current/voltage. For example, if the sensed current drawn by a memory cell exceeds a reference current, the memory cell's logic state is evaluated as a logic 1; otherwise, the memory cell's logic state is evaluated as a logic 0.

One concern with conventional memory sensing technology is that fixed references may not correctly evaluate the logic state of a memory cell when one or more characteristics of the memory cell (e.g., threshold voltage, drain current) change and/or degrade over time. For example, if at the beginning of life of a memory cell, the current sensed during a read operation of the memory cell exceeds a fixed reference current, the logic state of the memory cell is evaluated as a logic 1. However, if characteristics of the memory cell change after a period of time, causing current sensed during a read operation of the memory cell to be below the fixed reference current, the logic state of the memory cell is evaluated as a logic 0—data stored in the memory cell cannot reliably be determined. Therefore, the usable life of a memory cell terminates when a fixed reference cannot account for changes in the memory cell's characteristics.

Another concern with conventional memory sensing technology is that dynamic tracking references may not correctly evaluate the logic state of a memory cell when one or more characteristics of the memory cell shift over time—a memory cell's characteristics can change inconsistently compared to characteristics of a dynamic tracking reference. Therefore, when a fixed reference cannot account for changes in the memory cell's characteristics, data stored in the memory cell cannot reliably be determined. Therefore, the usable life of a memory cell terminates when a fixed reference cannot account for changes in the memory cell's characteristics.

It is therefore desirable to have systems and methods that can extend the usable lifetime of memory cells by avoiding limitations of conventional sensing techniques.

SUMMARY

The claimed subject matter relates to systems and methods for extending the usable lifetime of memory cells by utilizing reference-free sampled sensing. Conventional sensing techniques are limited since these techniques may not fully account for changes in a memory cell's characteristics. Compared to traditional sensing methods, the novel reference-free sampled sensing systems and methods of the claimed subject matter increase the usable lifetime of memory cells by determining a memory cell's logic state from sampled data.

The following presents a simplified summary of the innovation in order to provide a basic understanding of some aspects described herein. This summary is not an extensive overview of the disclosed subject matter. It is intended to neither identify key or critical elements of the disclosed subject matter nor delineate the scope of the subject innovation. Its sole purpose is to present some concepts of the disclosed subject matter in a simplified form as a prelude to the more detailed description that is presented later.

The subject invention provides systems and methods for extending the usable lifetime of memory cells by utilizing reference-free sampled sensing. In accordance with one aspect of the disclosed subject matter, a stimulus component can apply a plurality of different stimuli to a plurality of memory cells of a memory device. A sense component can sense a characteristic of each memory cell of the plurality of memory cells as a function of the applied plurality of different stimuli. An analysis component can determine a logic state of each memory cell of the plurality of memory cells as a function of the sensed characteristic of each memory cell of the plurality of memory cells.

In accordance with another aspect of the disclosed subject matter, a data store component can store the sensed characteristic of each memory cell of the plurality of memory cells. The analysis component can determine the logic state of each memory cell of the plurality of memory cells as a function of the stored sensed characteristic of each memory cell of the plurality of memory cells. In accordance with yet another aspect of the disclosed subject matter, the stimulus component comprises at least one of applying a bit-line voltage to the plurality of memory cells, applying a word-line voltage to the plurality of memory cells, pre-charging an output of one or more memory cells of the plurality of memory cells to a reference voltage, or applying a current to bit-lines of the plurality of memory cells.

In accordance with one aspect of the disclosed subject matter, the sense component comprises at least one of sensing the rate of current discharge of an output of one or more memory cells of the plurality of memory cells, sensing a voltage of an output of one or more memory cells of the plurality of memory cells, or sensing a current of an output of one or more memory cells of the plurality of memory cells. The analysis component comprises at least one of determining the logic state of each memory cell of the plurality of memory cells by comparing the sensed characteristic of each memory cell of the plurality of memory cells with one or more numbers, each of the one or more numbers representing a number of memory cells of the plurality of memory cells known to be programmed to a particular logic state; or determining the logic state of each memory cell of the plurality of memory cells by associating the logic state with a minimum number of change of sensed logic states as a function of the applied plurality of different stimuli.

In accordance with another aspect of the disclosed subject matter, the sense component comprises one or more sense amplifiers, the one or more sense amplifiers comprising at least one of a resistor, a transistor, a pass gate, a latch, an operational amplifier, a comparator, or a window comparator. An output of each memory cell of the plurality of memory cells is coupled to a first input of one of the one or more sense amplifiers. A fixed comparison voltage is coupled to a second input of the one of the one or more sense amplifiers. The sense component senses the characteristic of each memory cell of the plurality of memory cells as a function of an output of at least one of the one or more sense amplifiers.

In accordance with yet another aspect of the disclosed subject matter, an output of the one or more sense amplifiers is coupled to a tri-state logic device, an output of each tri-state logic device is coupled to a latch, and an output of each latch is coupled to a pass gate. The sense component can sense the characteristic of each memory cell of the plurality of memory cells as a function of an output of at least one pass gate. In accordance with one aspect of the disclosed subject matter, an output of the one or more sense amplifiers is coupled to a first input of one or more other sense amplifiers. A target voltage is coupled to a second input of the one or more other sense amplifiers and is associated with a number of memory cells expected to be sensed at a logic state. The sense component can sense the characteristic of each memory cell of the plurality of memory cells as a function of the output of the one or more other sense amplifiers.

The following description and the annexed drawings set forth in detail certain illustrative aspects of the disclosed subject matter. These aspects are indicative, however, of but a few of the various ways in which the principles of the innovation may be employed. The disclosed subject matter is intended to include all such aspects and their equivalents. Other advantages and distinctive features of the disclosed subject matter will become apparent from the following detailed description of the innovation when considered in conjunction with the drawings.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

DETAILED DESCRIPTION

Embodiments of systems and methods that extend the usable lifetime of memory cells by utilizing reference-free sampled sensing are described herein.

In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrase "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
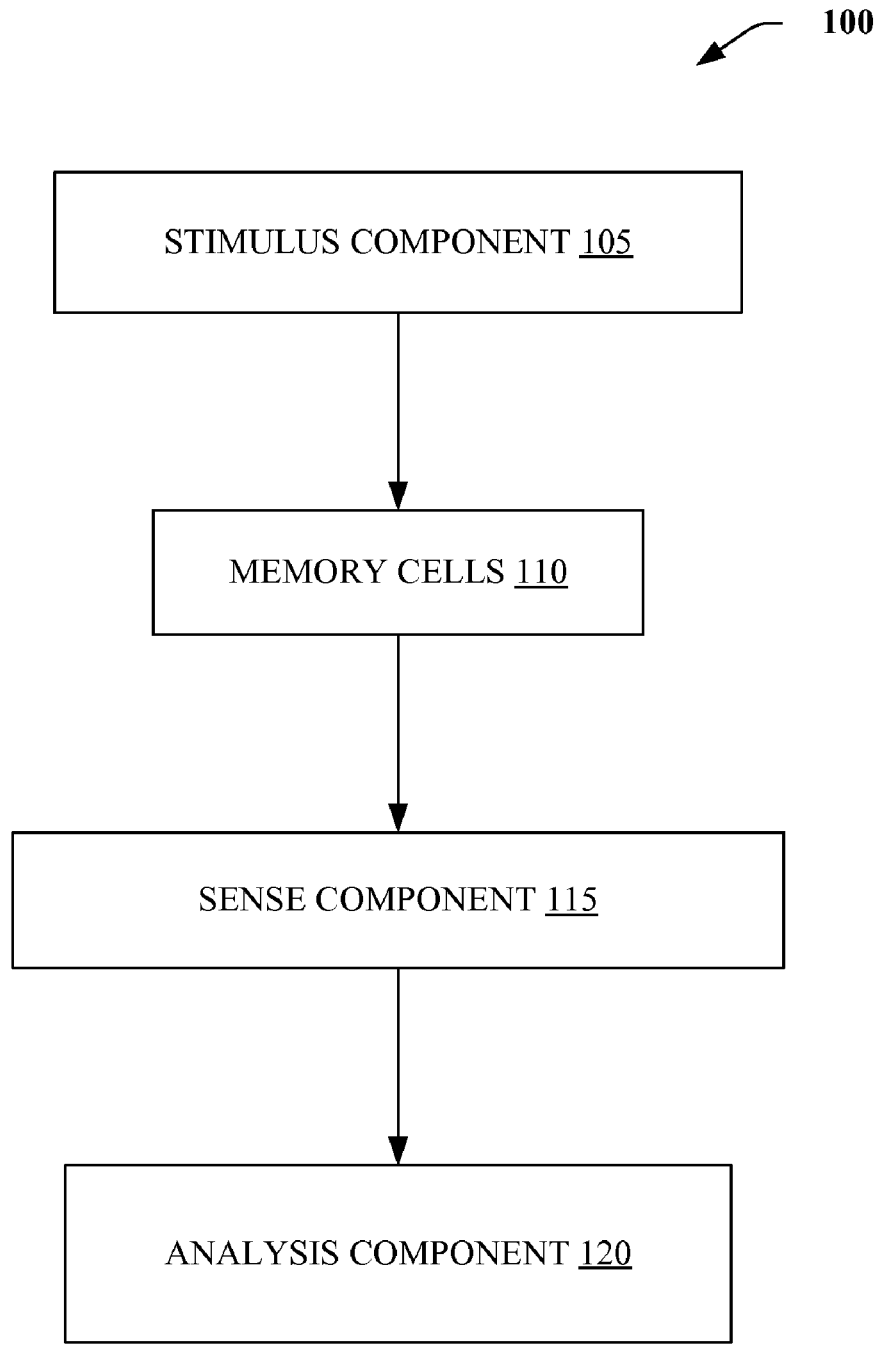
FIG. 1 is a demonstrative system for extending the usable lifetime of memory cells by utilizing reference-free sampled sensing, in accordance with an embodiment of the invention.

The subject invention provides systems and methods that extend the usable lifetime of memory cells by utilizing reference-free sampled sensing. Embodiments of the invention include techniques for determining a memory cell's logic state from sampled data, avoiding limitations of fixed and dynamic tracking sensing. FIG. 1 is a demonstrative system 100 for extending the usable lifetime of memory cells by utilizing reference-free sampled sensing, in accordance with an embodiment of the invention. System 100 and the systems and processes explained below may constitute machine-executable instructions embodied within a machine (e.g., computer) readable medium, which when executed by a machine will cause the machine to perform the operations described. Additionally, the systems and processes may be embodied within hardware, such as an application specific integrated circuit ("ASIC") or the like. The order in which some or all of the process blocks appear in each process should not be deemed limiting. Rather, it should be understood by a person of ordinary skill in the art having the benefit of the instant disclosure that some of the process blocks may be executed in a variety of orders not illustrated.

In system 100, a stimulus component 105 can apply a plurality of different stimuli to a plurality of memory cells 110. A sense component 115 can sense a characteristic of each memory cell of the plurality of memory cells 110 as a function of the applied plurality of different stimuli. An analysis component 120 can determine a logic state of each memory cell of the plurality of memory cells 110 based on the characteristic of each memory cell sensed as a function of the applied different stimuli. The subject invention avoids limitations of sensing memory cells utilizing fixed and dynamic tracking references—it extends the usable lifetime of memory cells by determining a memory cell's logic state as a function of the sensed characteristic of each memory cell of the plurality of memory cells 110.

In accordance with one embodiment, each memory cell of the plurality of memory cells 110 can be a non-volatile memory that is at least one of a flash memory (e.g., single-bit flash memory, multi-bit flash memory), read only memory ("ROM"), programmable ROM ("PROM"), erasable PROM ("EPROM"), electronically erasable PROM ("EEPROM"), or a combination thereof. In one embodiment, stimulus component 105 can apply at least one of a bit-line voltage to the plurality of memory cells 110, a word-line voltage to the plurality of memory cells 110, or pre-charge an output of one or more memory cells of the plurality of memory cells 110 to a reference voltage. Further, the sensed characteristic of each memory cell of the plurality of memory cells 110 comprises at least one of drain current, threshold voltage, gain, or logic state. However, it should be appreciated that stimulus component 105 can apply any stimulus to each memory cell of the plurality of memory cells 110, and sense component 115 can sense any characteristic of each memory cell of the plurality of memory cells 110.

In system 100, analysis component 120 can determine the logic state of each memory cell of the plurality of memory cells 110 by comparing the sensed characteristic of each memory cell of the plurality of memory cells 110 with one or more numbers, each of the one or more numbers representing a number of memory cells of the plurality of memory cells 110 known to be programmed to a particular logic state. Thus, although logic states of particular memory cells are unknown, the subject invention can determine the logic state of each memory cell when a total number of bits in a particular state is known. Analysis component 120 can also determine the logic state of each memory cell of the plurality of memory cells 110 by associating the logic state with a minimum number in change of sensed logic states as a function of the applied plurality of different stimuli. Unlike conventional sensing systems and/or methods, which can decrease the usable lifetime of memory cells and suffer from issues concerning lack of sensitivity of static and dynamic tracking references to changes in memory cell characteristics, the subject invention provides systems and methods that extend the usable lifetime of memory cells by determining a memory cell's logic state from sampled data.

Figure 2:
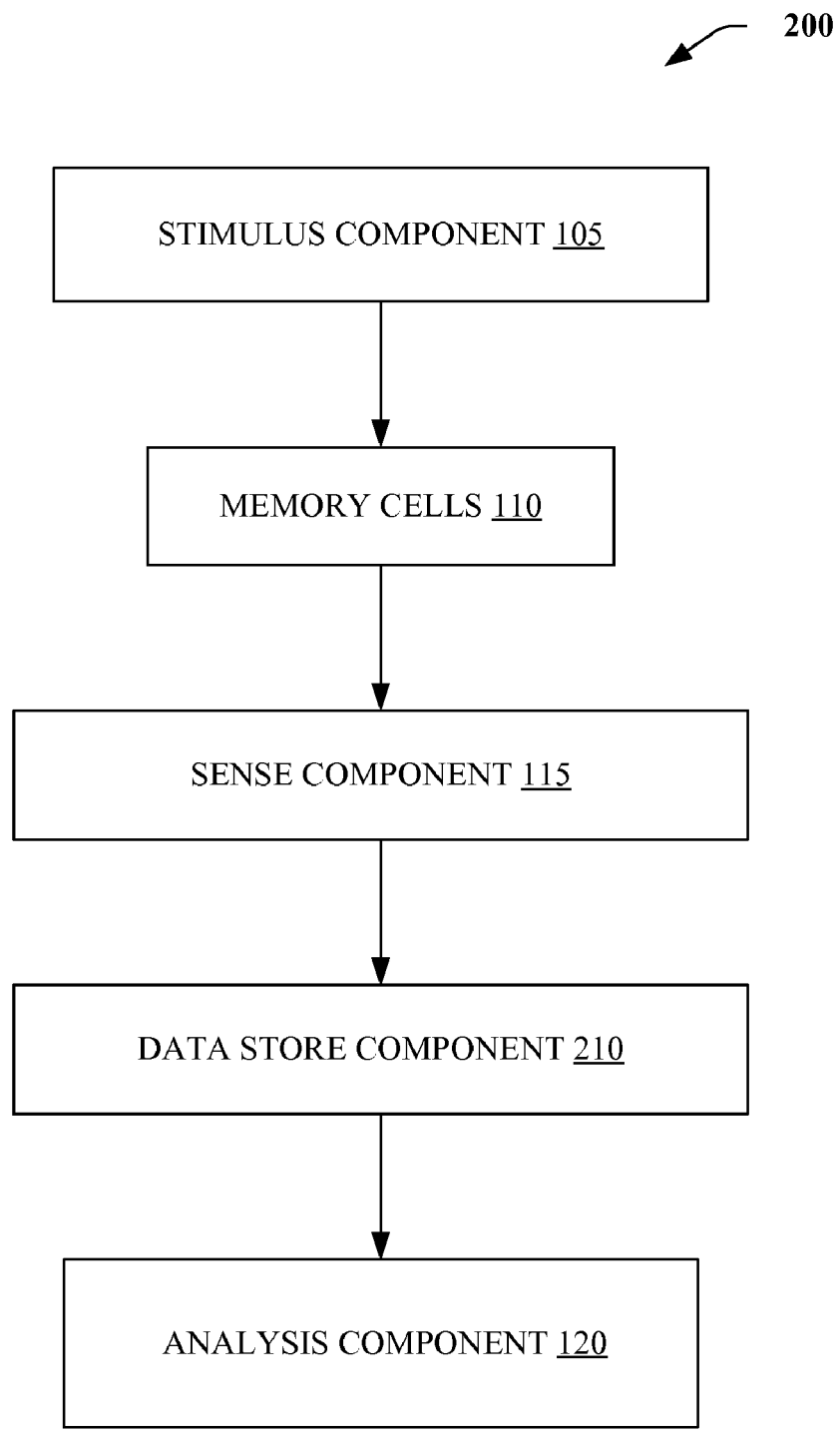
FIG. 2 is a demonstrative data store based system for extending the usable lifetime of memory cells by utilizing reference-free sampled sensing, in accordance with an embodiment of the invention.

FIG. 2 is a demonstrative data store based system 200 for extending the usable lifetime of memory cells by utilizing reference-free sampled sensing, in accordance with an embodiment of the invention. Data store system 200 can contain data store component 210, which can store a sensed characteristic of each memory cell of the plurality of memory cells 110. In one embodiment, data store component comprises a memory location. In other embodiments, data store component comprises a latch. In yet other embodiments, data store component can comprise a capacitor, the capacitor storing data in the form of retained charge. However, it should be appreciated that data store component 210 can comprise any type of device or function that is capable of retaining a state of a sensed characteristic of each memory cell of the plurality of memory cells 110. Analysis component 120 can determine the logic state of each memory cell based on the characteristic of each memory cell stored as a function of the applied different stimuli.

Figure 3:
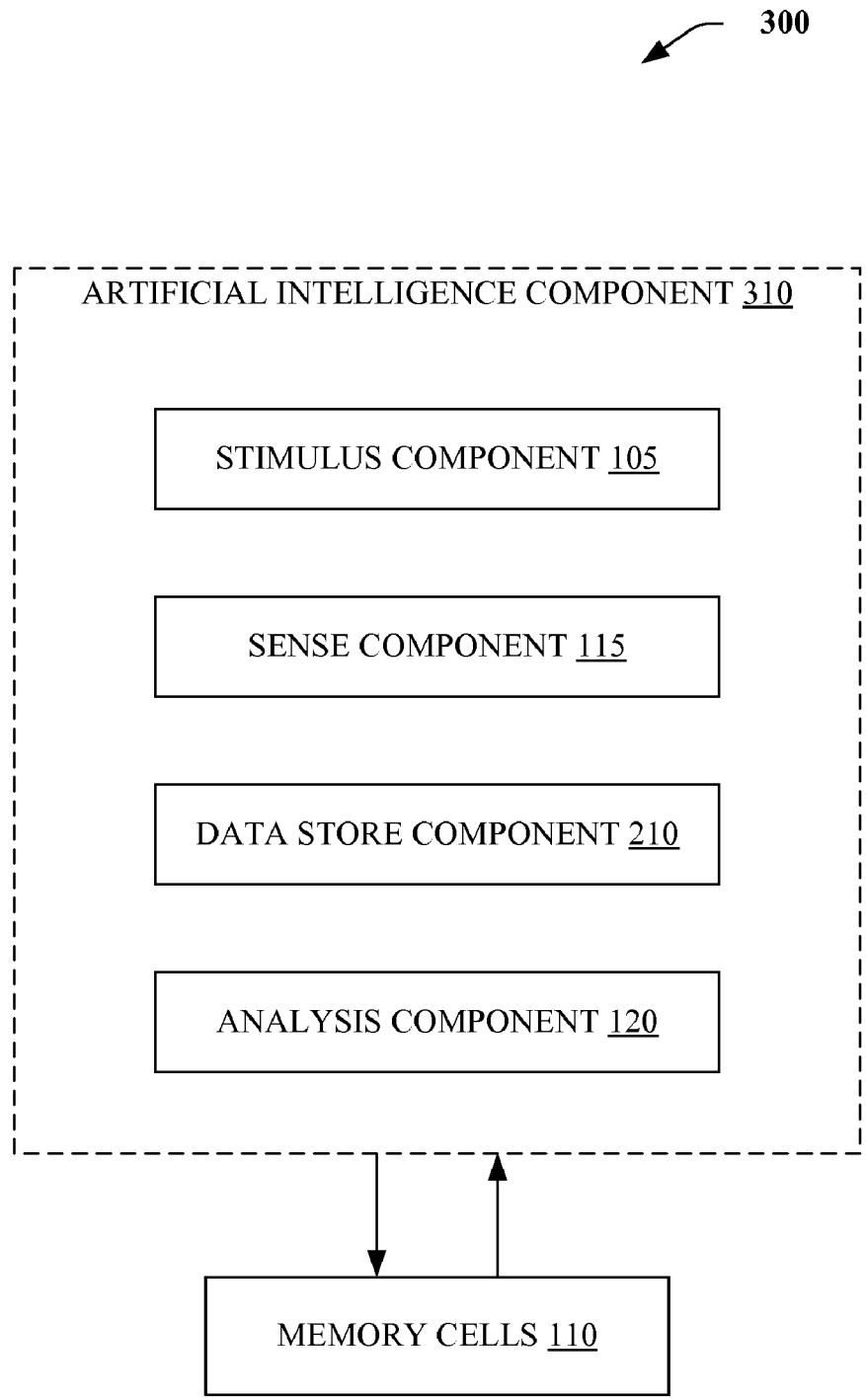
FIG. 3 is a demonstrative artificial intelligence based system for extending the usable lifetime of memory cells by utilizing reference-free sampled sensing, in accordance with an embodiment of the invention.

In accordance with an embodiment of the invention demonstrated by FIG. 3, an artificial intelligence based system 300 can extend the usable lifetime of memory cells by utilizing reference-free sampled sensing. Artificial intelligence based system 300 can contain an artificial intelligence component 310, in which data store component 210 can store a characteristic of each memory cell of the plurality of memory cells 110, the characteristic sensed by sense component 115 as a function of a plurality of different stimuli applied by stimulus component 105. Analysis component 120 can automatically determine the logic state of each memory cell of the plurality of memory cells 110 as a function of the characteristics stored by data store component 210. In one embodiment of artificial intelligence based system 300, artificial intelligence component 310 is a closed-loop feedback system that automatically determines the logic state of each memory cell of the plurality of memory cells 110 based on values sensed by sense component 115 and stored by data store component 210.

Figure 4:
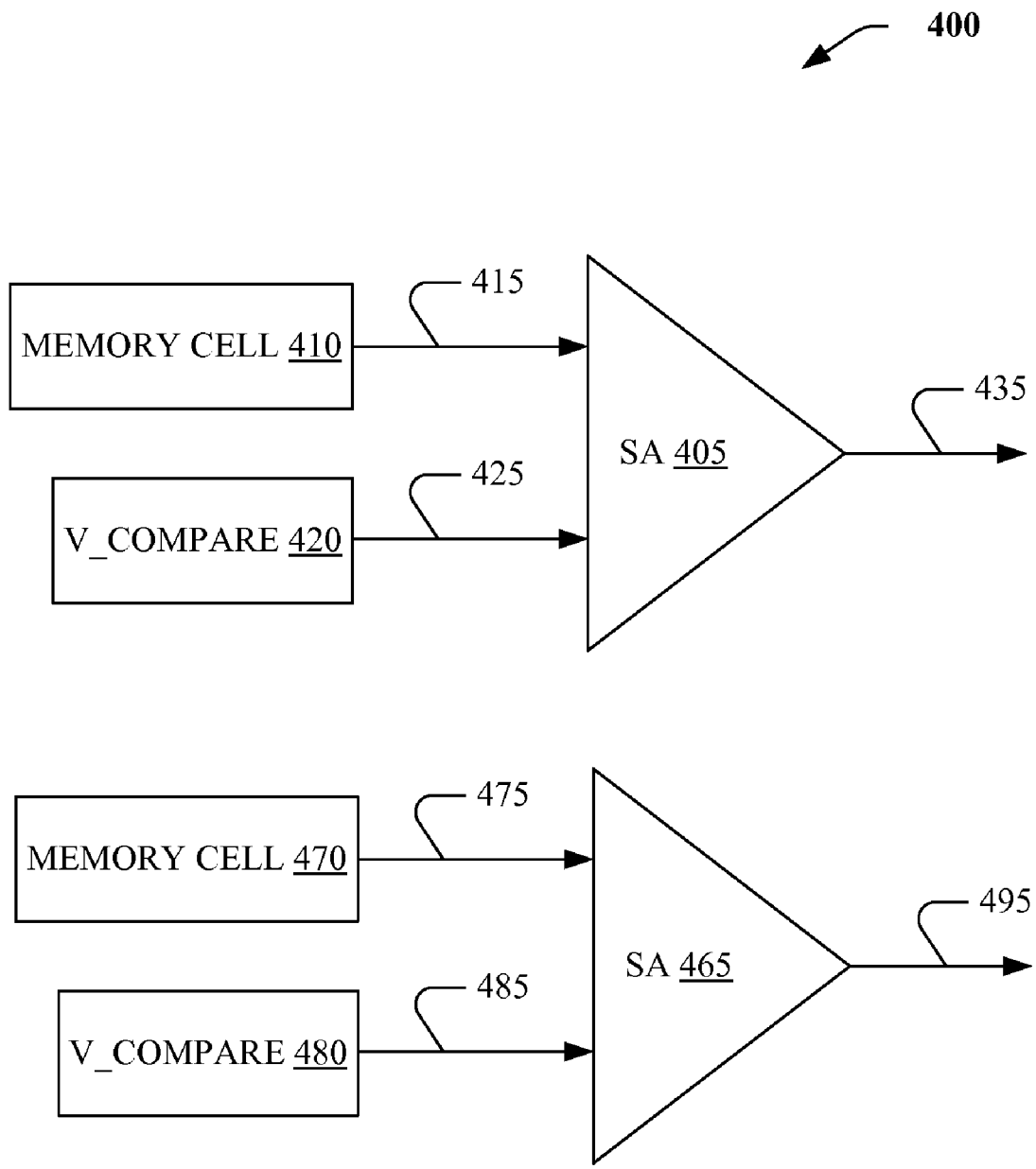
FIG. 4 is a schematic block diagram illustrating a sense circuit, in accordance with an embodiment of the invention.

FIG. 4 is a schematic block diagram illustrating a sense circuit 400, in accordance with an embodiment of the invention. An output of memory cell 410 is coupled to a first input 415 of sense amplifier 405. Fixed comparison voltage 420 is coupled to a second input 425 of sense amplifier 405. Further, an output of memory cell 470 is coupled to a first input 475 of sense amplifier 465. Fixed comparison voltage 480 is coupled to a second input 485 of sense amplifier 465. In response to stimulus component 105 applying a different stimulus to memory cells 410 and 470, sense component 115 can sense the logic state of memory cell 410 as a function of sense amplifier output 435, and sense component 115 can sense the logic state of memory cell 470 as a function of sense amplifier output 495.

In accordance with one embodiment, sense component 115 can sense a rate of current discharge of outputs 415 and 475. In accordance with another embodiment, sense component 115 can sense a voltage or current of outputs 415 and 475. In one embodiment, sense amplifiers 405 and 465 are resistors. In other embodiments, sense amplifiers 405 and 465 are transistors. In yet another embodiment, sense amplifiers 405 and 465 are comparators. However, it should be appreciated that sense amplifiers 405 and 465 can comprise any type of device or function that is capable of sensing, amplifying, and/or translating a sensed characteristic of each memory cell of the plurality of memory cells 110.

Figure 5:
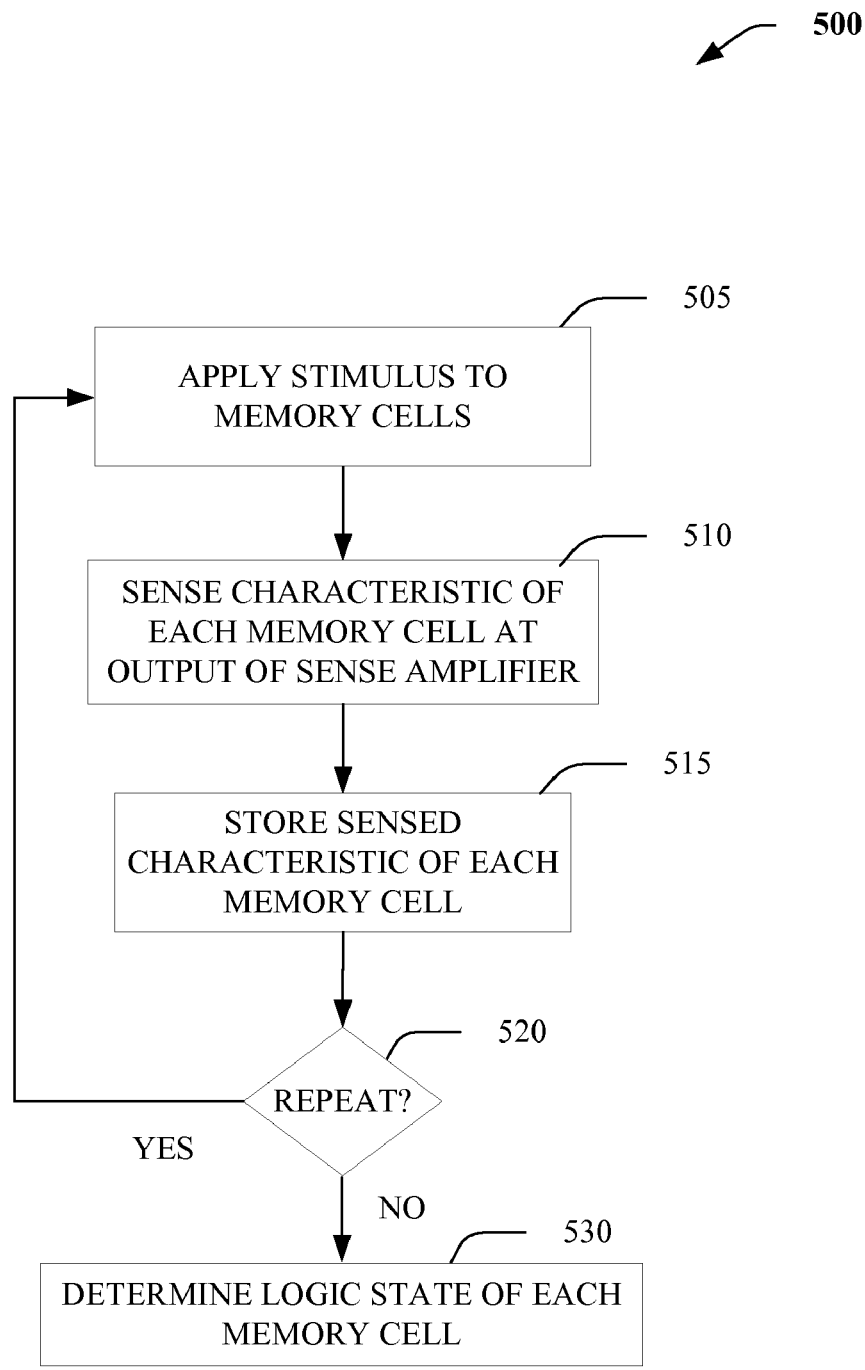
FIG. 5 is a flow chart illustrating determining a logic state of each memory cell of a plurality of memory cells, in accordance with an embodiment of the invention.

FIG. 5 is a flow chart illustrating a process 500 for determining a logic state of each memory cell of the plurality of memory cells, in accordance with an embodiment of the invention. At 505, stimulus component 105 can apply a different stimulus to each memory cell of the plurality of memory cells 110. In a process block 510, sense component 115 can sense a characteristic of each memory cell of the plurality of memory cells 110. At 515, data store component 210 can store the sensed characteristic of each memory cell of the plurality of memory cells 110. At a decision block 520, it can be decided whether to continue applying a different stimulus to each memory cell of the plurality of memory cells 110. If process 500 does not continue applying different stimuli, process 500 continues to process block 530, in which analysis component 120 can determine the logic state of each memory cell based on the characteristic of each memory cell stored as a function of the applied different stimuli.

Figure 6:
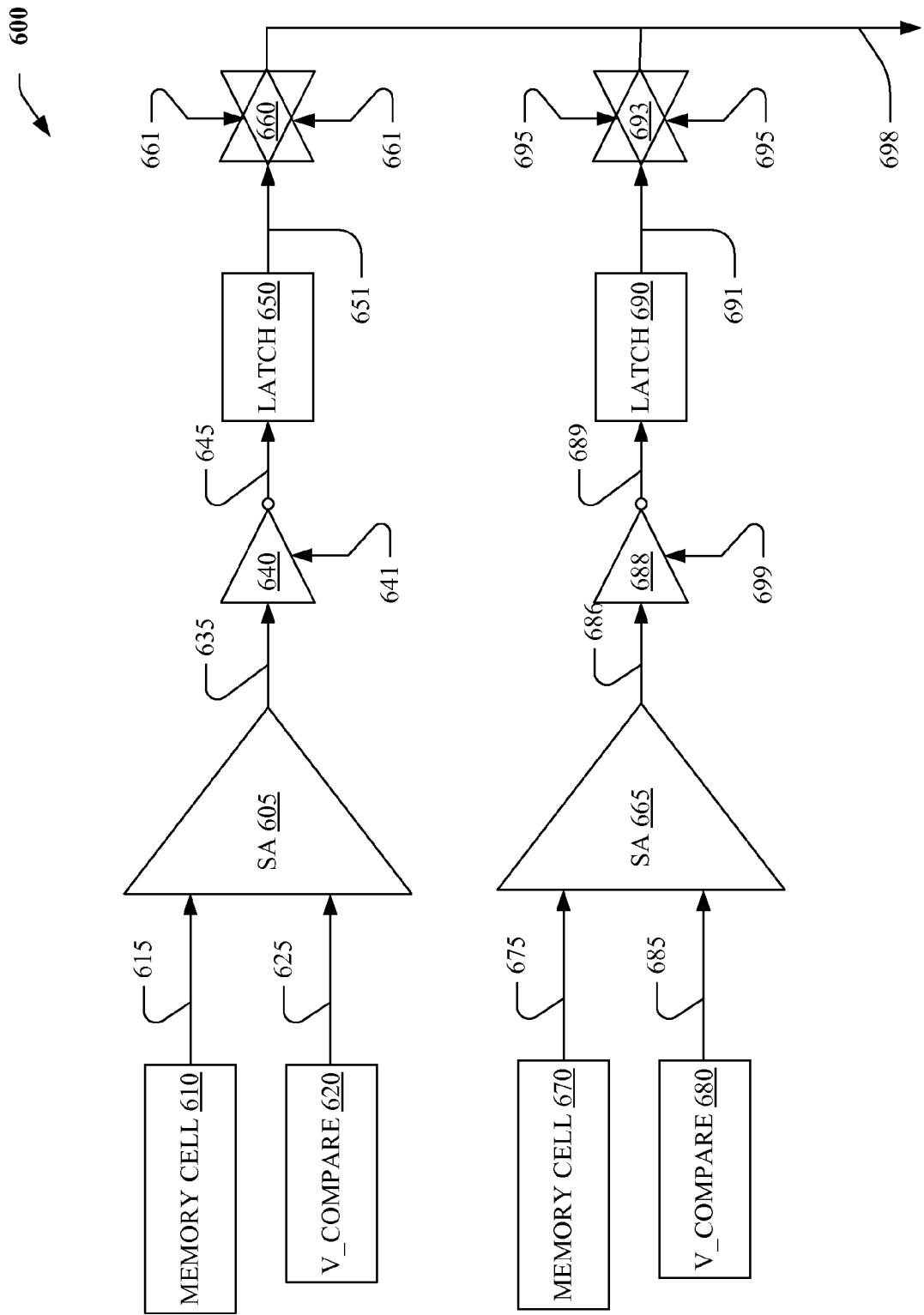
FIG. 6 is a schematic block diagram illustrating a sense circuit with latches, in accordance with an embodiment of the invention.

FIG. 6 is a schematic block diagram illustrating a sense circuit 600 with latches 650 and 690, in accordance with an embodiment of the invention. Output 635 of sense amplifier 605 is coupled to tri-state logic device 640. Output 686 of sense amplifier 665 is coupled to tri-state logic device 688. It should be appreciated that tri-state logic devices 640 and 688 can be any logic devices that perform a hi-impedance function (e.g., tri-state inverter). Output 645 of tri-state logic device 640 is coupled to latch 650. Output 689 of tri-state logic device 688 is coupled to latch 690. It should be appreciated that latches 650 and 690 can be any devices or functions that can store data.

In response to stimulus component 105 applying a different stimulus to memory cells 610 and 670, data store component 220 can store the logic states of memory cells 610 and 670 by enabling tri-state logic devices 640 and 688 (at 641 and 699) at a particular time (i.e., as a function of the applied different stimuli). In addition, analysis component 120 can determine the logic state of each memory cell of the plurality of memory cells 110 as a function of the logic states stored in latches 650 and 690, the logic states stored as a function of the applied different stimuli. Analysis component 120 can enable pass gate 660 at 661 to access a logic state stored in latch 650. Analysis component 120 can enable pass gate 693 at 695 to access a logic state stored in latch 690. In the embodiment illustrated by FIG. 6, the output of pass gate 660 is coupled to the output of pass gate 693. In other embodiments, an output of a pass gate is not coupled to an output of other pass gates.

Figure 7:
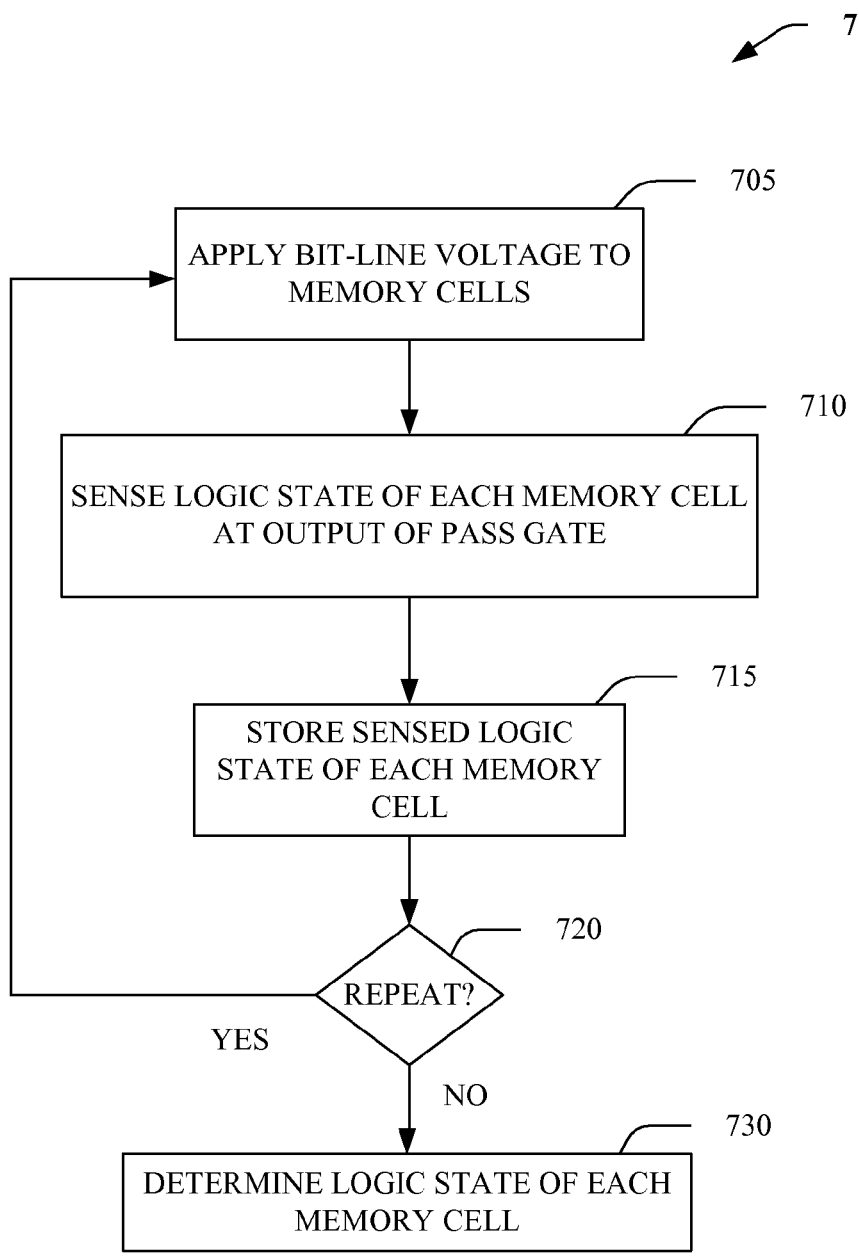
FIG. 7 is a flow chart illustrating determining a logic state of each memory cell as a function of an output of a pass gate, in accordance with an embodiment of the invention.

FIG. 7 is a flow chart illustrating a process 700 for determining a logic state of each memory cell as a function of an output of a pass gate, in accordance with an embodiment of the invention. At 705, stimulus component 105 can apply a bit-line voltage to the plurality of memory cells 110. In a process block 710, sense component 115 can sense a logic state of each memory cell of the plurality of memory cells 110. At 715, data store component 210 can store the logic state of each memory cell of the plurality of memory cells 110. At a decision block 720, it can be decided whether to continue to apply a different bit-line voltage to the plurality of memory cells 110. If process 700 does not apply a different bit-line voltage, process 700 continues to 730, in which analysis component 120 can determine the logic state of each memory cell based on the logic state of each memory cell stored as a function of the applied different bit-line voltages.

Figure 8:
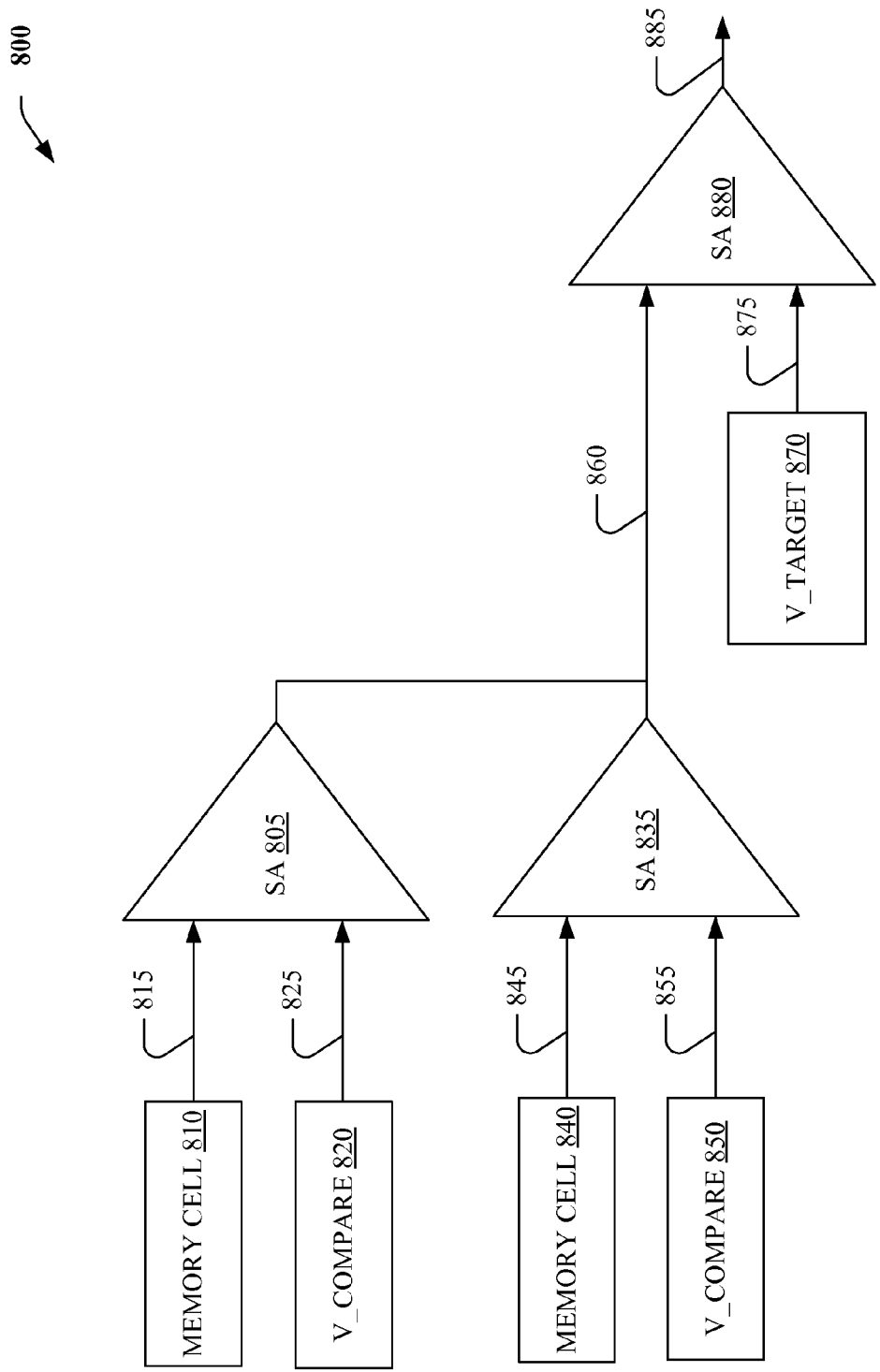
FIG. 8 is a schematic block diagram illustrating a sense circuit sensing a summation of logic states of more than one memory cell, in accordance with an embodiment of the invention.

FIG. 8 is a schematic block diagram illustrating a sense circuit 800 sensing a summation of logic states of more than one memory cell, in accordance with an embodiment of the invention. At 860, outputs of sense amplifiers 805 and 835 are coupled to a first input of sense amplifier 880. Target voltage 870 is coupled to a second input of sense amplifier 880 at 875. In one embodiment, target voltage 870 is associated with a number of memory cells expected to be sensed at a logic state. In response to stimulus component 105 applying a different stimulus to memory cells 810 and 840, sense component 115 can sense the sum of the logic states of memory cells 810 and 840 as a function of sense amplifier output 885.

Figure 9:
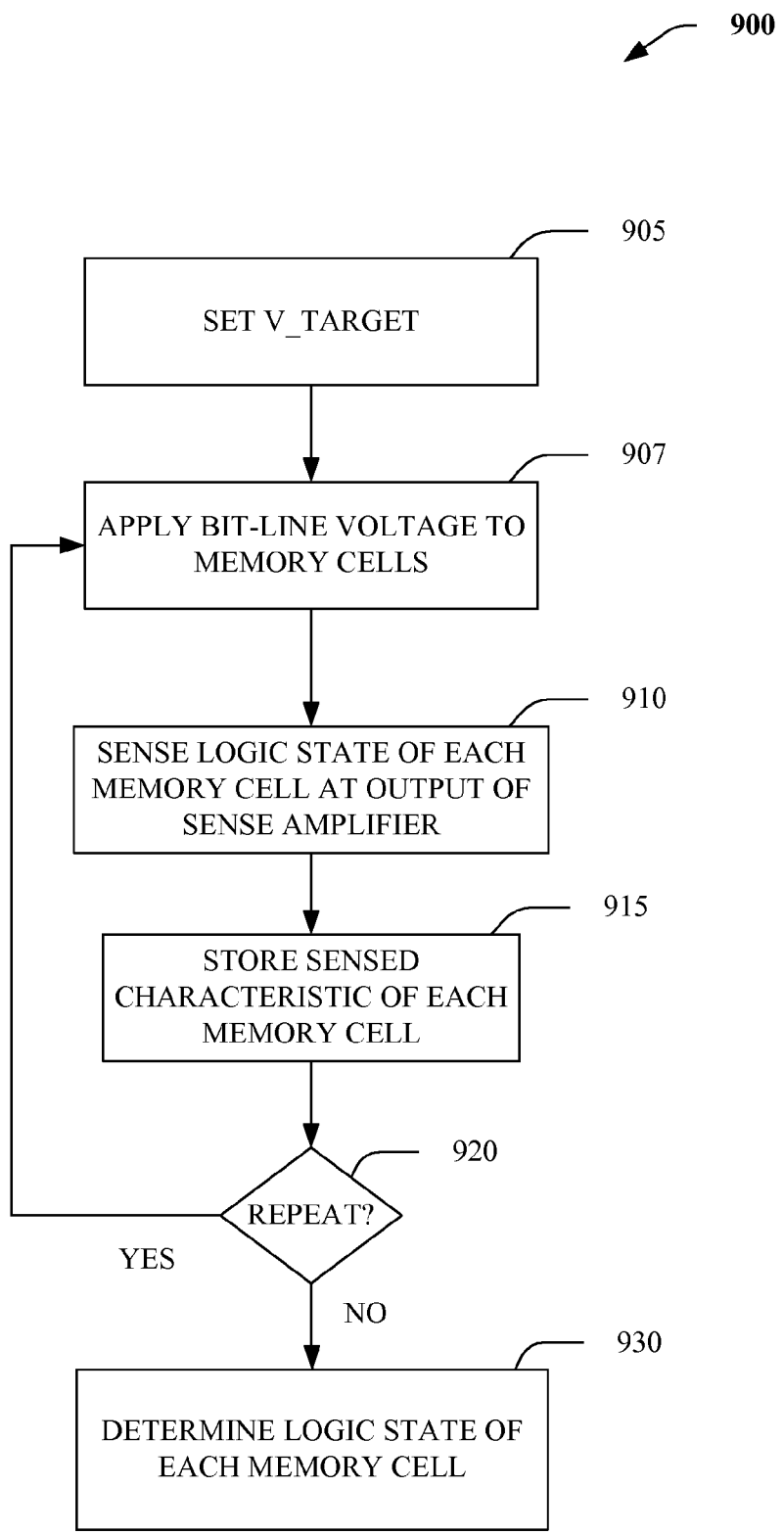
FIG. 9 is a flow chart illustrating a process for determining a logic state of each memory cell as a function of sensing a summation of a characteristic of more than one memory cell, in accordance with an embodiment of the invention.

FIG. 9 is a flow chart illustrating a process 900 for determining a logic state of each memory cell as a function of sensing a summation of a characteristic of more than one memory cell, in accordance with an embodiment of the invention. At 905, stimulus component 105 can set a target voltage associated with a number of memory cells expected to be sensed at a logic state. At 907, stimulus component 105 can apply a bit-line voltage to the plurality of memory cells 110. In a process block 910, sense component 115 can sense a logic state of each memory cell of the plurality of memory cells 110 at the output of a sense amplifier, the sense amplifier performing a summation of a characteristic of more than one memory cell. At 915, data store component 210 can store the logic state of each memory cell of the plurality of memory cells 110. At a decision block 920, it can be decided whether to continue to apply a different bit-line voltage to the plurality of memory cells 110. If process 900 does not apply a different bit-line voltage, process 900 continues to 930, in which analysis component 120 can determine the logic state of each memory cell based on the logic state of each memory cell stored as a function of the applied different stimuli.

Figure 10:
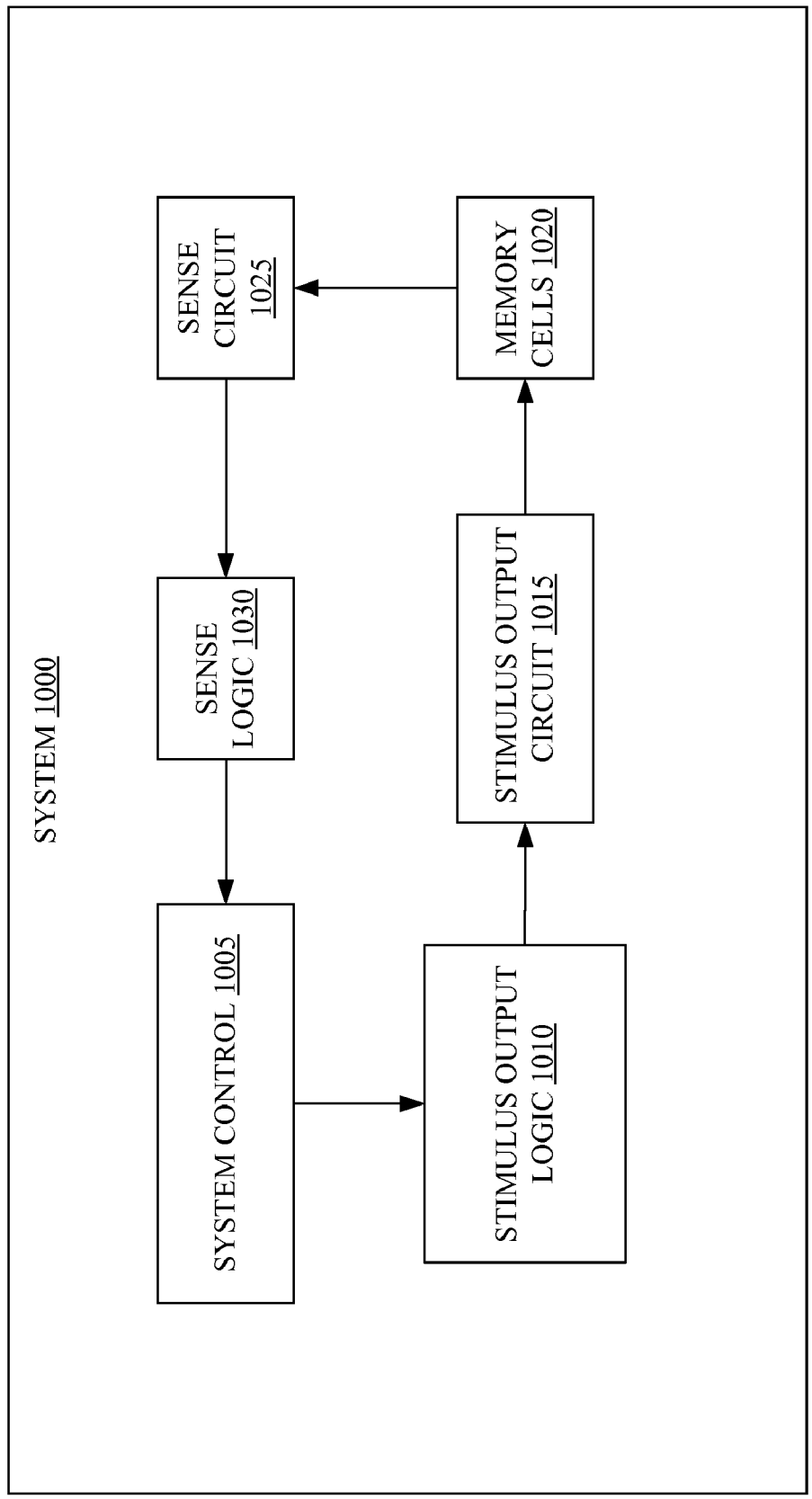
FIG. 10 is a more detailed demonstrative system for extending the usable lifetime of memory cells by utilizing reference-free sampled sensing, in accordance with an embodiment of the invention.

FIG. 10 is a more detailed demonstrative system 1000 for extending the usable lifetime of memory cells by utilizing reference-free sampled sensing, in accordance with an embodiment of the invention. System control 1005 can receive input from sense logic 1030 and can control stimulus output logic 1010. System control 1005 may include a computer that contains a central processing unit for making computations and performing various program and data transfers, and may also contain memory for program and data storage.

Stimulus output logic 1010 can receive information from system control 1005, and may include decode logic that decodes the information received from system control 1005 to control stimulus output circuit 1015. Stimulus output circuit 1015 can receive control logic from stimulus output logic 1010 and can translate the control logic into at least one of voltage or current.

A memory cell of memory cells 1020 may be a non-volatile memory that is at least one of flash memory, multi-bit flash memory, read only memory (ROM), programmable ROM (PROM), erasable programmable read only memory (EPROM), electronically erasable programmable read only memory (EEPROM), or a combination thereof. Sense circuit 1025 can sense at least one of drain current, threshold voltage, gain, or logic state. Also, sense circuit 1025 can transmit signals to sense logic 1030. Sense circuit 1025 may include multiple static references, comparators, window comparators, sense amplifiers, and any other elements that comprise sense circuits. Sense logic 1030 can receive signals sent by sense circuit 1025 and can translate the signals into logic that can be received by system controller 1005. Sense logic 1030 may translate the signals using encoding logic. It should be understood by a person of ordinary skill in the art having the benefit of the instant disclosure that system 1000 may comprise any hardware and/or software necessary to perform the above illustrated embodiments of the invention.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

As utilized herein, terms "component," "system," "interface," and the like are intended to refer to a computer-related entity, either hardware, software (e.g., in execution), and/or firmware. For example, a component can be a process running on a processor, a processor, an object, an executable, a program, and/or a computer. By way of illustration, both an application running on a server and the server can be a component. One or more components can reside within a process and a component can be localized on one computer and/or distributed between two or more computers.

Artificial intelligence based systems (e.g., explicitly and/or implicitly trained classifiers) can be employed in connection with performing inference and/or probabilistic determinations and/or statistical-based determinations as in accordance with one or more aspects of the disclosed subject matter as described herein. As used herein, the term "inference," "infer" or variations in form thereof refers generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events.

Inference can also refer to techniques employed for composing higher-level events from a set of events and/or data.

Such inference results in the construction of new events or actions from a set of observed events and/or stored event data, whether or not the events are correlated in close temporal proximity, and whether the events and data come from one or several event and data sources. Various classification schemes and/or systems (e.g., support vector machines, neural networks, expert systems, Bayesian belief networks, fuzzy logic, data fusion engines . . . ) can be employed in connection with performing automatic and/or inferred action in connection with the disclosed subject matter.

Furthermore, the disclosed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks (e.g., CD, DVD . . . ), smart cards, and flash memory devices (e.g., card, stick, key drive . . . ).

Further, it should be appreciated that a carrier wave can be employed to carry computer-readable electronic data such as those used in transmitting and receiving electronic mail or in accessing a network such as the Internet or a local area network (LAN). Of course, those skilled in the art will recognize many modifications may be made to this configuration without departing from the scope or spirit of the disclosed subject matter. Moreover, the word "exemplary" is used herein to mean serving as an example, instance, or illustration. Any aspect or design described herein as "exemplary" is not necessarily to be construed as preferred or advantageous over other aspects or designs.

Figure 11:
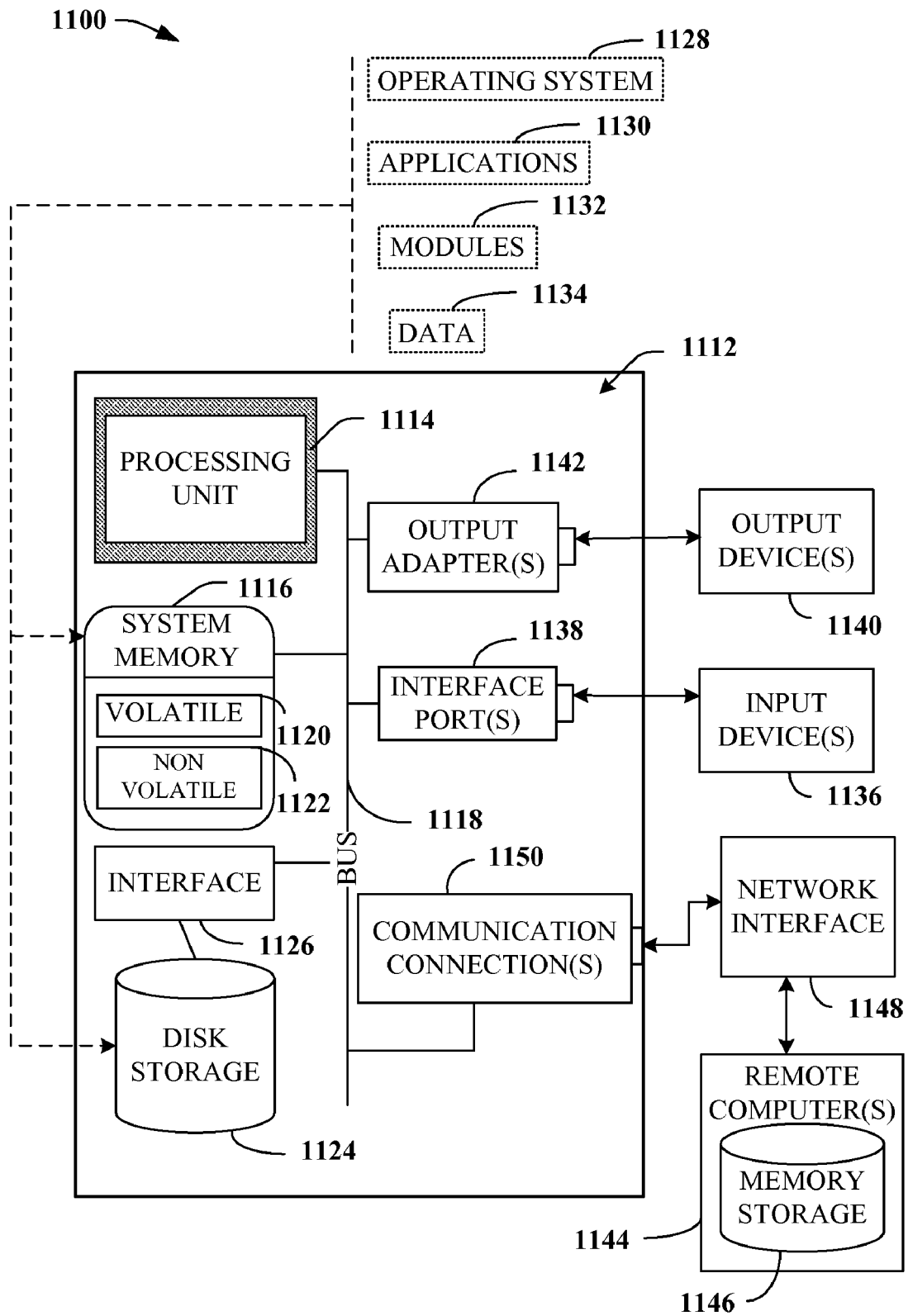
FIG. 11 is schematic block diagram illustrating a suitable operating environment.
Figure 12:
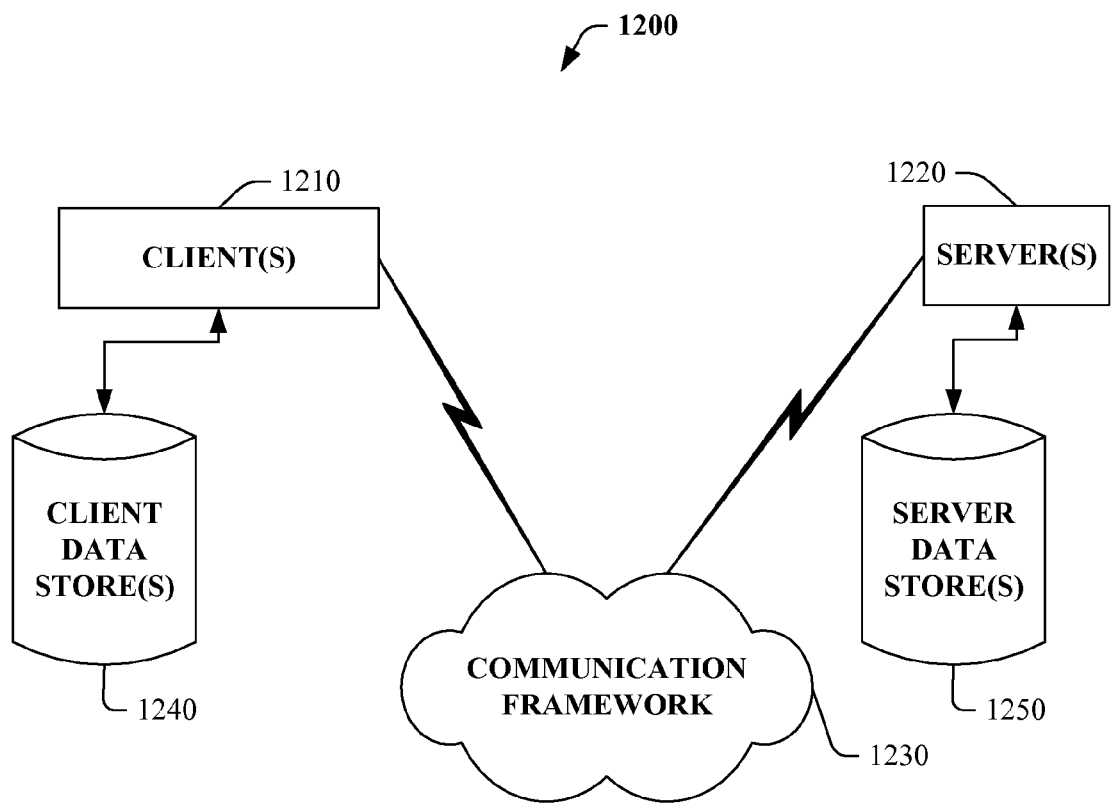
FIG. 12 is a schematic block diagram of a sample-computing environment.

In order to provide a context for the various aspects of the disclosed subject matter, FIGS. 11 and 12, as well as the following discussion, are intended to provide a brief, general description of a suitable environment in which the various aspects of the disclosed subject matter may be implemented. While the subject matter has been described above in the general context of computer-executable instructions of a computer program that runs on a computer and/or computers, those skilled in the art will recognize that the subject innovation also may be implemented in combination with other program modules. Generally, program modules include routines, programs, components, data structures, etc. that perform particular tasks and/or implement particular abstract data types.

Moreover, those skilled in the art will appreciate that the inventive systems may be practiced with other computer system configurations, including single-processor or multiprocessor computer systems, mini-computing devices, mainframe computers, as well as personal computers, hand-held computing devices (e.g. PDA, phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone computers. In a distributed computing environment, program modules may be located in both local and remote memory storage devices.

With reference to FIG. 11, a suitable environment 1100 for implementing various aspects of the claimed subject matter includes a computer 1112. The computer 1112 includes a processing unit 1114, a system memory 1116, and a system bus 1118. The system bus 1118 couples system components including, but not limited to, the system memory 1116 to the processing unit 1114. The processing unit 1114 can be any of various available processors. Dual microprocessors and other multiprocessor architectures also can be employed as the processing unit 1114.

The system bus 1118 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1116 includes volatile memory 1120 and nonvolatile memory 1122. The basic input/output system (BIOS), containing the basic routines to transfer information between elements within the computer 1112, such as during start-up, is stored in nonvolatile memory 1122. By way of illustration, and not limitation, nonvolatile memory 1122 can include ROM, PROM, EPROM, EEPROM, or flash memory. Volatile memory 1120 includes RAM, which acts as external cache memory. By way of illustration and not limitation, RAM is available in many forms such as SRAM, dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and Rambus dynamic RAM (RDRAM).

Computer 1112 also includes removable/non-removable, volatile/non-volatile computer storage media. FIG. 11 illustrates, for example, a disk storage 1124. Disk storage 1124 includes, but is not limited to, devices like a magnetic disk drive, floppy disk drive, tape drive, Jaz drive, Zip drive, LS-100 drive, flash memory card, or memory stick. In addition, disk storage 1124 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1124 to the system bus 1118, a removable or non-removable interface is typically used, such as interface 1126.

It is to be appreciated that FIG. 11 describes software that acts as an intermediary between users and the basic computer resources described in the suitable operating environment 1100. Such software includes an operating system 1128. Operating system 1128, which can be stored on disk storage 1124, acts to control and allocate resources of the computer system 1112. System applications 1130 take advantage of the management of resources by operating system 1128 through program modules 1132 and program data 1134 stored either in system memory 1116 or on disk storage 1124. It is to be appreciated that the disclosed subject matter can be implemented with various operating systems or combinations of operating systems.

A user enters commands or information into the computer 1112 through input device(s) 1136. Input devices 1136 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1114 through the system bus 1118 via interface port(s) 1138. Interface port(s) 1138 include, for example, a serial port, a parallel port, a game port, and a universal serial bus (USB). Output device(s) 1140 use some of the same type of ports as input device(s) 1136.

Thus, for example, a USB port may be used to provide input to computer 1112, and to output information from computer 1112 to an output device 1140. Output adapter 1142 is provided to illustrate that there are some output devices 1140 like monitors, speakers, and printers, among other output devices 1140, which require special adapters. The output adapters 1142 include, by way of illustration and not limitation, video and sound cards that provide a means of connection between the output device 1140 and the system bus 1118. It should be noted that other devices and/or systems of devices provide both input and output capabilities such as remote computer(s) 1144.

Computer 1112 can operate in a networked environment using logical connections to one or more remote computers, such as remote computer(s) 1144. The remote computer(s) 1144 can be a personal computer, a server, a router, a network PC, a workstation, a microprocessor based appliance, a peer device or other common network node and the like, and typically includes many or all of the elements described relative to computer 1112.

For purposes of brevity, only a memory storage device 1146 is illustrated with remote computer(s) 1144. Remote computer(s) 1144 is logically connected to computer 1112 through a network interface 1148 and then physically connected via communication connection 1150. Network interface 1148 encompasses wire and/or wireless communication networks such as local-area networks (LAN) and wide-area networks (WAN). LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1150 refer(s) to the hardware/software employed to connect the network interface 1148 to the bus 1118. While communication connection 1150 is shown for illustrative clarity inside computer 1112, it can also be external to computer 1112. The hardware/software necessary for connection to the network interface 1148 includes, for exemplary purposes only, internal and external technologies such as, modems including regular telephone grade modems, cable modems and DSL modems, ISDN adapters, and Ethernet cards.

FIG. 12 is a schematic block diagram of a sample-computing environment 1200 with which the subject innovation can interact. The system 1200 includes one or more client(s) 1210. The client(s) 1210 can be hardware and/or software (e.g., threads, processes, computing devices). The system 1200 also includes one or more server(s) 1220. Thus, system 1200 can correspond to a two-tier client server model or a multi-tier model (e.g., client, middle tier server, data server), amongst other models. The server(s) 1220 can also be hardware and/or software (e.g., threads, processes, computing devices). The servers 1220 can house threads to perform transformations by employing the subject innovation, for example. One possible communication between a client 1210 and a server 1220 may be in the form of a data packet transmitted between two or more computer processes.

The system 1200 includes a communication framework 1230 that can be employed to facilitate communications between the client(s) 1210 and the server(s) 1220. The client(s) 1210 are operatively connected to one or more client data store(s) 1240 that can be employed to store information local to the client(s) 1210. Similarly, the server(s) 1220 are operatively connected to one or more server data store(s) 1250 that can be employed to store information local to the servers 1220.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art should recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A system comprising:
    at least one processor that executes the following computer executable components:
    a stimulus component that applies a plurality of different stimuli to a plurality of memory cells of a memory device;
    a sense component that senses a characteristic of each memory cell of the plurality of memory cells as a function of the applied plurality of different stimuli; and
    an analysis component that determines a logic state of each memory cell of the plurality of memory cells as a function of the sensed characteristic of each memory cell of the plurality of memory cells by at least one of:
        comparing the sensed characteristic of each memory cell of the plurality of memory cells with one or more numbers, wherein each of the one or more numbers represents a number of memory cells of the plurality of memory cells programmed to a particular logic state; or
        associating the logic state with a minimum number in change of sensed logic states as a function of the applied plurality of different stimuli.

2. The system of claim 1, further comprising:
    a data store component that stores the sensed characteristic of each memory cell of the plurality of memory cells;
    wherein the analysis component determines the logic state of each memory cell of the plurality of memory cells as a function of the stored sensed characteristic of each memory cell of the plurality of memory cells.

3. The system of claim 2, further comprising:
    an artificial intelligence component that automatically:
        applies the plurality of different stimuli to the plurality of memory cells;
        senses the characteristic of each memory cell of the plurality of memory cells;
        stores the sensed characteristic of each memory cell of the plurality of memory cells; and
        determines the logic state of each memory cell of the plurality of memory cells.

4. The system of claim 1, wherein the stimulus component at least one of:

applies a bit-line voltage to the plurality of memory cells;
applies a word-line voltage to the plurality of memory cells;
pre-charges an output of one or more memory cells of the plurality of memory cells to a reference voltage; or
applies a current to bit-lines of the plurality of memory cells.

5. The system of claim 4, wherein the sensed characteristic of each memory cell of the plurality of memory cells comprises at least one of a drain current, a threshold voltage, a gain, or a logic state.

6. The system of claim 5, wherein the sense component at least one of:
senses a rate of discharge of current of an output of one or more memory cells of the plurality of memory cells;
senses a voltage of an output of one or more memory cells of the plurality of memory cells; or
senses a current of an output of one or more memory cells of the plurality of memory cells.

7. The system of claim 6, wherein the sense component comprises:
one or more sense amplifiers comprising at least one of a resistor, a transistor, a pass gate, a latch, an operational amplifier, a comparator, or a window comparator.

8. The system of claim 7, wherein an output of each memory cell of the plurality of memory cells is coupled to a first input of one of the one or more sense amplifiers, wherein a fixed comparison voltage is coupled to a second input of the one of the one or more sense amplifiers, and wherein the sense component senses the characteristic of each memory cell of the plurality of memory cells as a function of an output of at least one of the one or more sense amplifiers.

9. The system of claim 8, wherein an output of the one or more sense amplifiers is coupled to a tri-state logic device, wherein an output of each tri-state logic device is coupled to a latch, wherein an output of each latch is coupled to a pass gate, and wherein the sense component senses the characteristic of each memory cell of the plurality of memory cells as a function of an output of at least one pass gate.

10. The system of claim 9, wherein an output of each pass gate is coupled to an output of one or more other pass gates.

11. The system of claim 8, wherein an output of the one or more sense amplifiers is coupled to a first input of one or more other sense amplifiers and wherein a target voltage is coupled to a second input of the one or more other sense amplifiers.

12. The system of claim 11, wherein the target voltage coupled to the second input of the one or more other sense amplifiers is associated with a number of memory cells expected to be sensed at a logic state.

13. The system of claim 12, wherein the sense component senses the characteristic of each memory cell of the plurality of memory cells as a function of the output of the one or more other sense amplifiers.

14. The system of claim 1, wherein each memory cell of the plurality of memory cells is a non-volatile memory that is at least one of flash memory, multi-bit flash memory, read only memory (ROM), programmable ROM (PROM), erasable programmable read only memory (EPROM), electronically erasable programmable read only memory (EEPROM), or a combination thereof.

15. A method comprising:
employing at least one processor to execute computer executable instructions stored on at least one computer readable medium to perform the following acts:
applying different stimuli to a plurality of memory cells of a memory device;
identifying a characteristic of each memory cell of the plurality of memory cells as a function of the applied plurality of different stimuli; and
establishing a logic state of each memory cell of the plurality of memory cells as a function of the identified characteristic of each memory cell of the plurality of memory cells by at least one of:
comparing the identified characteristic of each memory cell of the plurality of memory cells with one or more values, wherein each value of the one or more values represents an amount of memory cells of the plurality of memory cells programmed at a particular logic state; or
associating the logic state of the memory cell with a minimum number in change of identified logic states based on the applied different stimuli.

16. The method of claim 15, the employing including employing at least one processor to execute the computer executable instructions to further perform at least one of the following acts:
applying a bit-line voltage to one or more memory cells of the plurality of memory cells;
applying a word-line voltage to one or more memory cells of the plurality of memory cells;
pre-charging an output of one or more memory cells of the plurality of memory cells to a reference voltage; or
applying a current to bit-lines of one or more memory cells of the plurality of memory cells.

17. The method of claim 16, the employing including employing at least one processor to execute the computer executable instructions to further perform at least one of the following acts:
sensing a rate of discharge of current associated with an output of one or more memory cells of the plurality of memory cells;
sensing a voltage associated with an output of one or more memory cells of the plurality of memory cells;
sensing a current associated with an output of one or more memory cells of the plurality of memory cells;
sensing the characteristic of each memory cell of the plurality of memory cells as a function of one or more outputs of one or more sense amplifiers, wherein an output of each memory cell of the plurality of memory cells is coupled to at least one of the one or more sense amplifiers; or
sensing the characteristic of each memory cell of the plurality of memory cells as a function of an output of one or more pass gates, wherein an output of each memory cell of the plurality of memory cells is coupled to at least one sense amplifier, wherein an output of the at least one sense amplifier is coupled to a tri-state logic device, wherein an output of the tri-state logic device is coupled to a latch, and wherein an output of the latch is coupled to the one or more pass gates.

18. A system comprising:
means for applying unique stimuli to a plurality of memory cells of a memory device;
means for detecting a characteristic of each memory cell of the plurality of memory cells based on the applied unique stimuli; and
means for deriving a logic state of each memory cell of the plurality of memory cells based on the detected characteristic each memory cell of the plurality of memory cells, wherein the means for deriving the logic state comprises at least one of:

means for comparing the detected characteristic of each memory cell of the plurality of memory cells with one or more numeric quantities, wherein each of the one or more numeric quantities represents a number of memory cells of the plurality of memory cells programmed in a particular logic state; or means for detecting a change in logic states of the plurality of memory cells based on the applied unique stimuli, and means for relating the logic state of the memory cell with a smallest detected change in logic states of the plurality of memory cells;

wherein instructions associated with one or more of the above means are executed by one or more processors operatively coupled to one or more memory devices.

* * * * *